United States Patent
Wickman

(10) Patent No.: US 6,868,207 B2
(45) Date of Patent: Mar. 15, 2005

(54) METHOD TO DIFFRACT AND ATTENUATE AN OPTICAL SIGNAL

(75) Inventor: Randy Wickman, Cadott, WI (US)

(73) Assignee: Corona Optical Systems, Inc., Lombard, IL (US)

( * ) Notice: Subject to any disclaimer, the term of this patent is extended or adjusted under 35 U.S.C. 154(b) by 0 days.

(21) Appl. No.: 10/044,866

(22) Filed: Jan. 10, 2002

(65) Prior Publication Data

US 2003/0128925 A1 Jul. 10, 2003

(51) Int. Cl.[7] .............................. G02B 6/34; G02B 6/43
(52) U.S. Cl. ............................ 385/37; 385/39; 385/52; 385/89
(58) Field of Search ............................... 385/27, 37, 39, 385/49, 51, 52, 73, 88, 94, 89

(56) References Cited

U.S. PATENT DOCUMENTS

| | | | | |
|---|---|---|---|---|
| 5,412,506 A | * | 5/1995 | Feldblum et al. ............ 359/569 |
| 5,428,704 A | * | 6/1995 | Lebby et al. ................ 521/137 |
| 5,513,289 A | * | 4/1996 | Hosokawa et al. ............ 385/33 |
| 5,568,574 A | * | 10/1996 | Tanguay et al. ............... 385/14 |
| 5,790,730 A | * | 8/1998 | Kravitz et al. ................ 385/49 |
| 6,056,448 A | * | 5/2000 | Sauter et al. .................. 385/92 |
| 6,267,515 B1 | * | 7/2001 | Okuda et al. .................. 385/88 |
| 6,434,294 B1 | * | 8/2002 | Gallo ........................... 385/27 |
| 6,469,785 B1 | * | 10/2002 | Duveneck et al. ........... 356/244 |
| 2002/0039463 A1 | * | 4/2002 | Degertekin et al. ........... 385/12 |
| 2003/0002803 A1 | * | 1/2003 | Trezza et al. .................. 385/53 |
| 2003/0031435 A1 | * | 2/2003 | Yeh et al. ..................... 385/120 |

* cited by examiner

Primary Examiner—John D. Lee
(74) Attorney, Agent, or Firm—Welsh & Katz, Ltd.

(57) ABSTRACT

A method and apparatus are provided for transmitting an optical communications signal. The method includes the steps of disposing a plurality of optical gratings on a surface of an optically transparent substrate, disposing an optical array having a plurality of optical ports adjacent the optically transparent substrate such that an axis of transmission of the optical array passes directly through the substrate, and transmitting a plurality of optical signals of the optical array substantially through the plurality of optical gratings in the substrate.

14 Claims, 5 Drawing Sheets

METHOD TO DIFFRACT AND ATTENUATE AN OPTICAL SIGNAL

FIELD OF THE INVENTION

The present invention relates to optical communication devices, and more specifically to the structure of optoelectronic couplers.

BACKGROUND OF THE INVENTION

Traditionally, VCSEL dies are vertically mounted to a printed circuit board, or PCB, with light emitting from the same surface as the electrical contacts. The PCB is usually made of FR4 or ceramic. As shown in the prior art of FIG. 1, a TO assembly can 12 has wire bonds 16 used in electrically connecting the VCSEL die 14. Wire bonds 16 are more susceptible to damage than solder bumps, and are generally avoided if possible. In addition, wire bonding is inconsistent in terms of variance in electrical properties. As the wire lengths tend to vary, variance exists in resistance, inductance, or capacitance along the lines.

As shown in FIG. 1, the TO can's base comprises a header 20 and a conductive spacer 18. A metallic structure 22, referred to as a can, provides a hermetic seal for a VCSEL laser array 14. Optical signals 26 exit the TO can 12 through a lens 24, and may be appropriately coupled into a waveguide (not shown). Lensing mechanisms are often needed to couple light as desired into a waveguide or optical fiber. For example, a VCSEL laser die contains electrical contacts on the same surface of light emission, and wire bonding to that surface will increase the minimum distance from the active surface of the laser to the optical fiber. As a result, the signal may require lensing to gather diverging light.

Additionally, multiple optical devices on the same substrate, such as VCSEL's on a PCB, can have a number of optical losses and/or interferences associated with them, one of which is cross talk. Light emitting from an optical port diverges from a normal transmission axis and could interfere with light from other optical ports. By increasing the optical device density on a substrate, the need to accurately couple light from an optical port into its respective waveguide or fiber increases. If the distance from a coupling device to the optical port increases, less of the divergent light will be collected. Given the feasibility limitations in changing optical fiber diameter, complicated lensing mechanisms are needed to appropriately couple light as desired.

FIG. 2 shows another prior art optical converter assembly 30. In this method of transmitting optical signals through an optical fiber 38, light strikes an end surface 40 of the optical fiber 38 and reflects into the optical fiber 38, along the longitudinal axis. As shown, wire bonds 42 are used to electrically connect the optical transmitting device 34 to a first substrate 32. Because of the position of the wire bonds 42, the position of the optical fiber 38 is limited to above the wire bonds 42.

In addition, this method of coupling optical signals requires precision optical alignment structures 36. The assembly does not allow the optical fiber 38 to be placed relatively close to the optical transmitting device 34, possibly reducing optical integrity. Complex alignment structures are thus required to gather light as desired.

A method of attaching a VCSEL die using metal to metal contacts such as solder bumps or stud bumps can make closer connections that are more consistent in electrical variance and offer greater structural stability than wire bonds. This method of attaching is commonly referred to as flip chipping. Wire bonding will add to the overall height in the package more so than flip chipping, as shown in FIGS. 1 and 2. As a result of flip chipping, more light could be gathered from an optical port into a waveguide or optical fiber. By flip chipping an optical array to a substrate, optical fibers can be placed closer to the active surface of the laser, possibly eliminating the need for lensing structures, while maintaining signal integrity. In addition, closer optical fibers to the optical array surface can reduce optical cross-talk caused by the scattering of light.

In moving a wave guide or optical fiber closer to an optical port, the total amount of light gathered can increase. As it is desirable to uniformly collect light over the optical source's total emission field, it is not necessarily advantageous to gather as much light as possible. Capturing too much light could cause a few problems, one of which is eye safety. As a laser can cause permanent damage to the human eye, it is imperative to ensure that a laser's output does not come in contact with a human eye in a hazardous manner. To do this, the net amount of light output could be decreased or absorbed in order to promote an eye safe device. That is, enough light output could be decreased or absorbed to maintain signal integrity but promote eye safety.

Another possible consequence in gathering too much light involves the inability of a receiving optical device to process the light energy. A photo detection device may provide an electrical output that is proportional to the amount of light energy received from a transmitting device. If the input signal to a photodetector contains too much light energy, the photodetector could become saturated. That is, the linear proportionality between the incoming light energy and the outgoing electrical signal could diminish, and the photodetector may not respond accordingly to too much light energy. Additionally, if the photodetector has not already saturated, the signal processor receiving the electrical signal from the photodetector could become saturated. That is, the signal processor's limits will have been reached because the value of the input electrical signal could be too high. Because of these two consequences in gathering too much light energy, it is necessary to appropriately reduce the optical energy received by a photo detection device.

The present invention provides a novel way to couple light from an optical device, into a waveguide, and subsequently into an optical fiber. The invention offers ease in manufacturing and does not require the use of precision alignment devices typically needed for the manufacturing of optical devices. It may simultaneously function as a spatial field homogenizer and an optical attenuator for an optical transmitting device. It may also allow a higher optical device density on a common substrate while not adversely affecting the signal integrity. In addition, the invention may promote eye safety while maintaining signal integrity.

SUMMARY OF THE INVENTION

A method and apparatus are provided for transmitting an optical communications signal. The method includes the steps of disposing a plurality of optical gratings on a surface of an optically transparent substrate, disposing an optical array having a plurality of optical ports adjacent the optically transparent substrate such that an axis of transmission of the optical array passes directly through the substrate, and transmitting a plurality of optical signals of the optical array substantially through the plurality of optical gratings in the substrate.

DETAILED DESCRIPTION OF THE INVENTION

Figure 1:
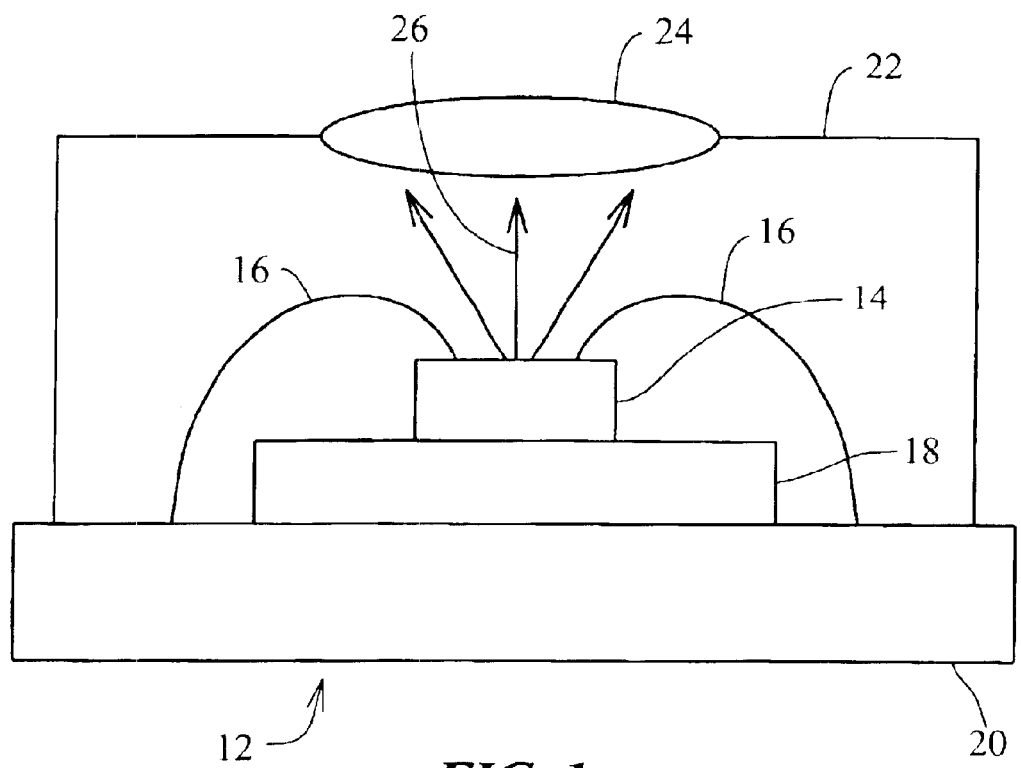
FIG. 1 is a front view of a prior art converter assembly related to the invention. The figure illustrates a common TO can and its elements.
Figure 2:
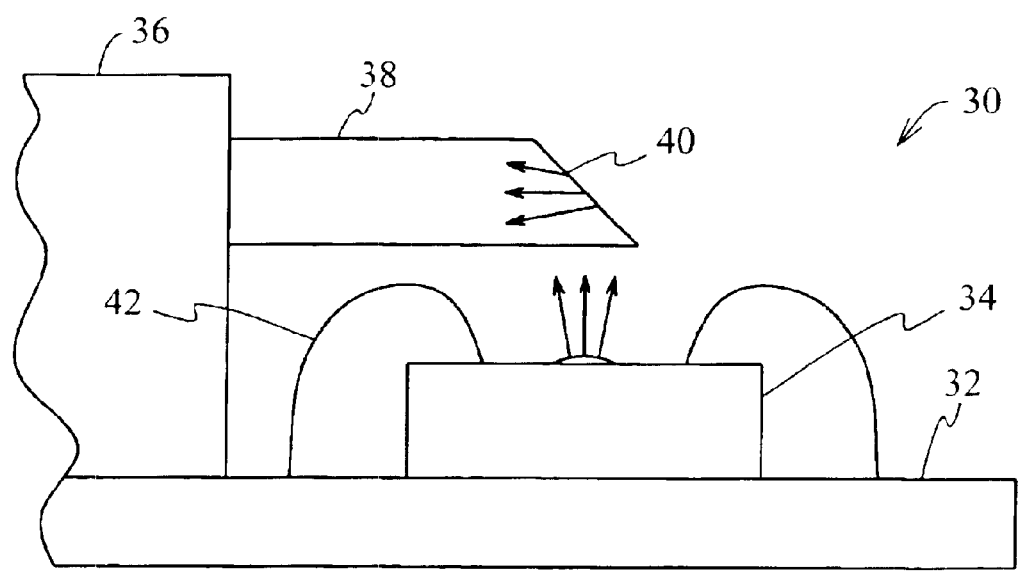
FIG. 2 depicts another example of a prior art converter assembly.
Figure 3:
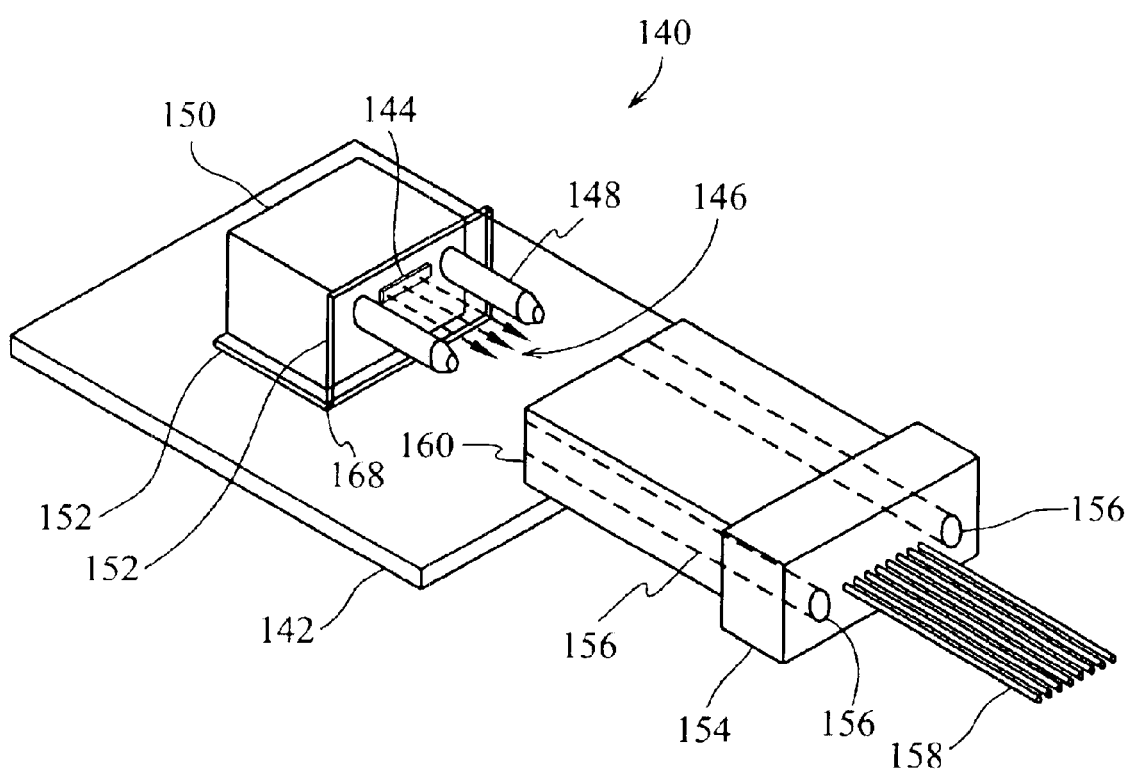
FIG. 3 is a profile view of the electro-optic communications assembly of an illustrated embodiment of the present invention.

FIG. 3 shows an electro-optic communications assembly 140 in accordance with the invention and in a context of use. The assembly 140 may include a common substrate 142, or printed circuit board (PCB), an optically transparent substrate 152 attached to the PCB 142, an active optical array 144 attached to the substrate 152, and an optical connector 154 for holding optical fibers 158 in alignment with the optical array 144. Alignment guides 148, held in place by a pin holder 150, may be used to align the optical fibers 158 of the optical connector 154 to the optical array 144.

The PCB 142, may be any suitable material such as FR4, ceramic interconnect, or the like. The PCB 142 may have a plurality of electrical and optical devices for signal processing, as well as electrical traces and electrical pads (not shown in the figure). The optically transparent substrate 152 may comprise an L-shaped glass or a glass-like structure having desirable optical and structural properties, and could be about 100 microns in thickness. The substrate 152 may be attached to the PCB 142 by an adhesive, solder/stud bumps, or a similar material. The electrical connections between the substrate 152 and PCB 142 can be made by using solder, stud bumps, wire bonds, ribbon bonds, or similar techniques. The substrate 152 may also contain a right angle bend 168 at an appropriate location to allow planarity of optical signals 146 of the optical array 144 with respect to the PCB 142, as shown in the figure.

Figure 4:
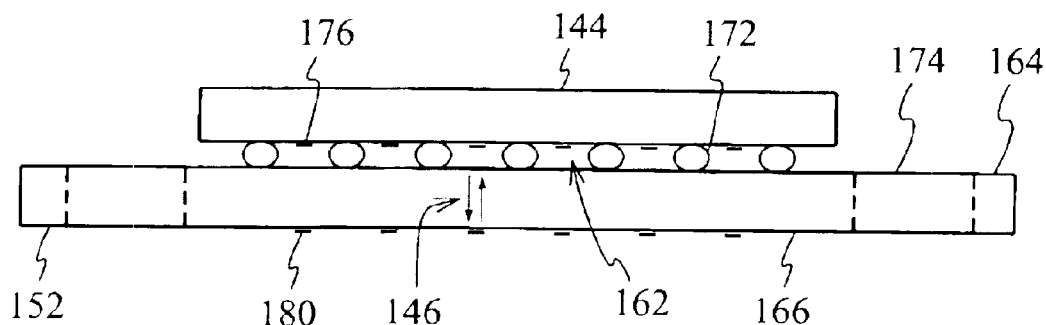
FIG. 4 is a top view of an optical array and a substrate as shown in FIG. 3.

FIG. 4 illustrates a top view of the vertical portion of the L-shaped substrate 152 as first shown in FIG. 3 (In this figure, the pin holder 150 has been removed to illustrate the detail of the optical array 144 and the substrate 152). The substrate assembly may comprise the active optical array 144, conventional electrical pads/bumps 172, and conductive traces (not shown), all disposed on a first surface 164 of the substrate. The substrate 152 may also comprise diffraction gratings 180 disposed on a second surface of the substrate 166. The use of diffraction gratings may be used to attenuate, focus, and homogenize the optical signal transmitting through the optically transparent substrate 152. The physical embodiment and the use of the gratings 180 will be described in further detail below.

It will be understood that the active optical array 144 can be any suitable photonic device or array of photonic devices including photo-transmitters, photo-receivers, or a combination thereof. A photo-transmitter can be any suitable device such as an edge emitting laser, a vertical cavity surface emitting laser (VCSEL), light emitting diode (LED), or the like. Furthermore, any suitable photo-receiving device can be used, such as a photodiode, P-I-N diode, PN diode, MSM diode, or the like. Thus, the active optical array 144 can be a broad range of photoactive devices with transmitting and receiving capabilities. The optical array 144 may have a number of optical ports 176, and each optical port 176 may be a photonics transmitter, receiver, or a combination transmitter/receiver, (FIG. 4 shows six optical ports 176, yet the number of ports 176 is not limited to a specific value). The transmission paths 146 of the optical ports 176 may propagate directly through the optically transparent substrate 152 to which the optical device 144 is attached. The optical signals may pass through the substrate 152 in either a guided or unguided configuration.

A set of apertures 174 for receiving the alignment guide pins 148 may be formed in the transparent substrate 152. The apertures 174 may properly align the optical ports 176 of the optical array 144 to the optical fibers 158 of the optical connector 154, as shown in FIG. 3.

The alignment pins 148, held in place by the alignment pin holder 150 shown in FIG. 3, could then be inserted concurrently through apertures 156 formed on a first surface 160 of the optical connector 154. This collinearly aligns the transmission axis of optical ports 176 of the optical array 144 to the respective optical fibers 158 of the optical connector 154. (In a preferred embodiment of the invention, the optical connector 154 could be a standard MT connector, or ferrule, manufactured by US Conec or Nippon Telephone & Telegraph; US Conec Part number MTF-12MM7).

FIG. 4 also shows an optically transparent underfill 162 that may be disposed in the space between the optical array 144 and the substrate 152. The underfill 162 may mechanically attach the optical array 144 to a first surface 164 of the substrate 152. The thickness of the underfill 162 may be 50–60 microns, or about the thickness of conventional stud bumps 172. It could be applied to the substrate 152 before the optical array 144 and the substrate 152 are connected, (i.e., the underfill 162 could be applied before or after the optical array 144 is attached to the substrate 152). The underfill 162 could be applied using a conventional syringe technique. The preferred method of application is a conventional pin transfer technique. Upon applying the underfill 162, the underfill cures for an appropriate amount of time. Use of an epoxy underfill for IC's is common, and details of composition, application, or curing will not be discussed in detail.

In a preferred embodiment of the present invention, the underfill 162 is an epoxy supplied by Epoxy Technology of Billerica, Mass. (commonly referred to as Epo-Tek). Two epoxies that have been used under an illustrated embodiment of the invention are Epo-Tek's U300 and OE121. Additional epoxies displaying adequate optical properties could be used for this application as well. The optical signal's transmission paths 146 originating from the optical ports 176 may sequentially pass directly through the underfill 162 and the optically transparent substrate 152. The underfill 162 may also function as an encapsulant, thus protecting the optical ports 176 of the optical array 144 from unwanted, harsh chemicals and the like.

The underfill 162 may be used in conjunction with solder balls or the like for mechanically attaching the optical array 144 to the substrate 152. The underfill 162 could be the primary or secondary mechanical support, or it could be used for the other reasons listed above.

Figure 5:
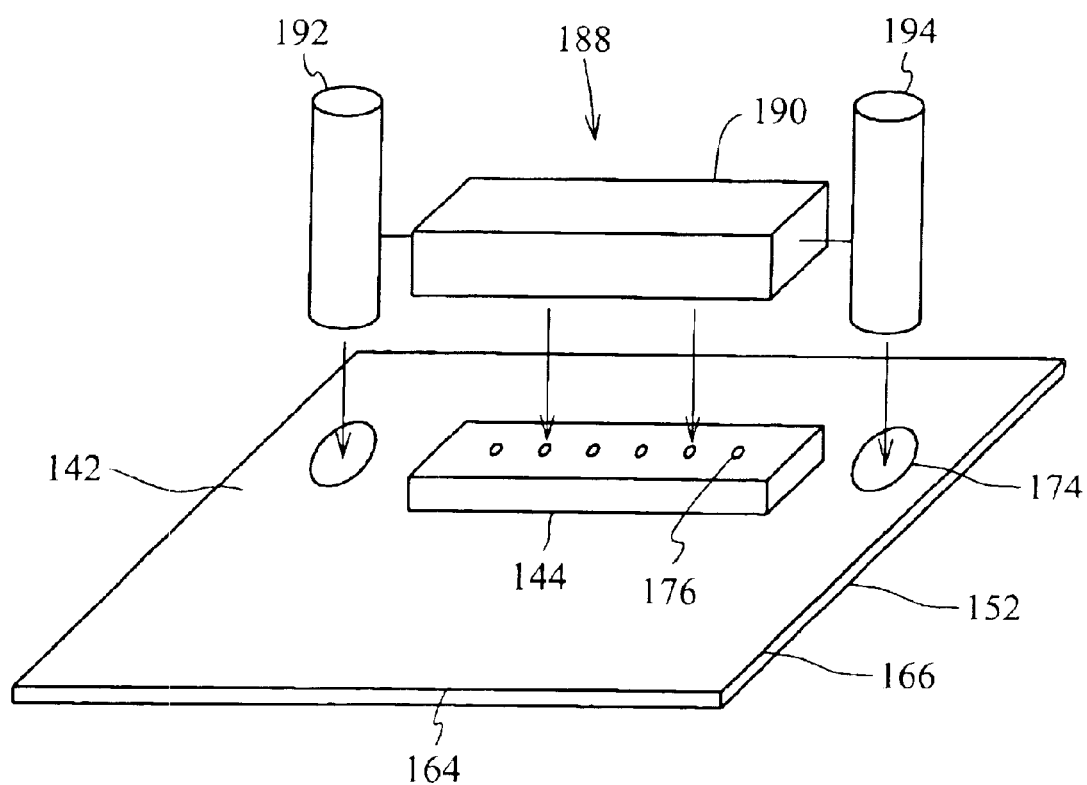
FIG. 5 is a profile view of the substrate of FIG. 3.

Turning now to FIG. 5, a boring fixture 188 may be used to form the apertures 174 in the substrate 152. The fixture 188 may include a pattern recognition module 190 and lasers 192, 194. The pattern recognition module 190 may include software adapted to recognize and position itself over a line of targets (not shown) on the optical array 144.

Once recognition of targets has occurred, the pattern recognition module 190 functions to identify a transverse line passing through the line of targets as well as a center point of the line of targets. The pattern recognition module 190 then positions its own transverse line and center point with the identified transverse line and center point. The lasers 192, 194 may be precisely aligned along the transverse line of the pattern recognition module 190. The lasers 192, 194 are also positioned a precise distance on either side of the center point of the pattern recognition module 190.

The pattern recognition module 190 may be programmed to view the array 144 through the transparent substrate 152 and identify the set of alignment targets (e.g., the alignment targets on opposing ends of the array 144). Once the pattern recognition module 190 has aligned itself with the recognition targets (and also the lasers 192, 194 on either side of the targets), the boring fixture 188 activates the lasers 192, 194 to ablate the holes 174 in precise alignment with the ports 176.

Figure 6:
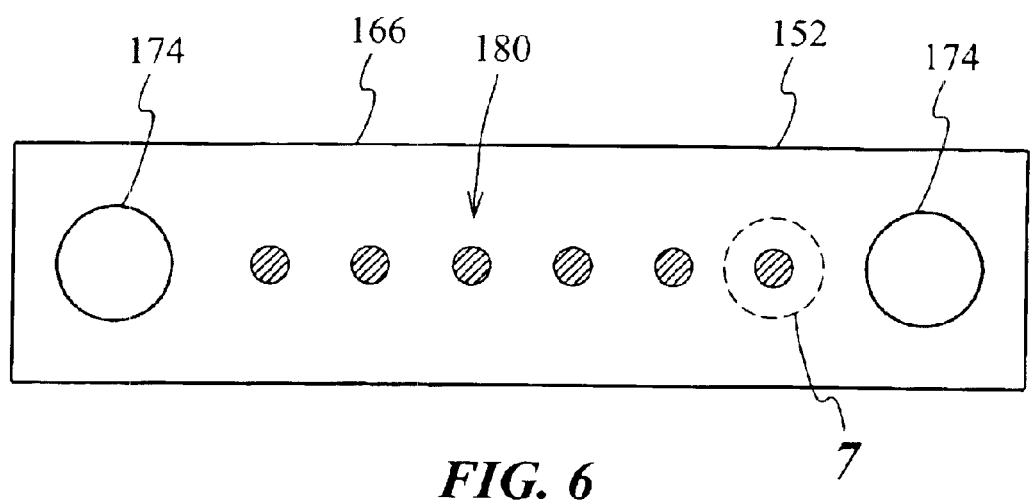
FIG. 6 is an enlarged front view of the substrate of FIG. 3.
Figure 7:
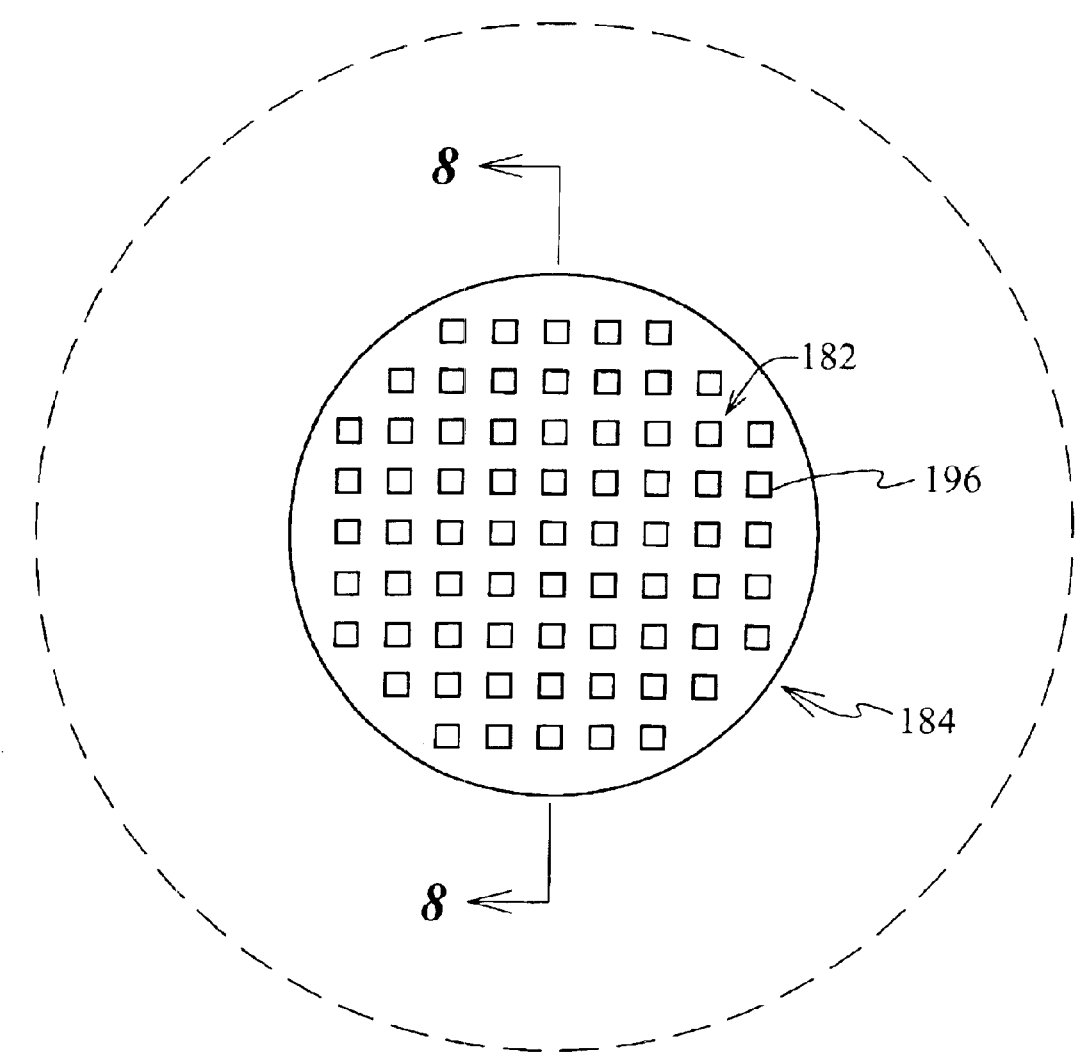
FIG. 7 is a section view of FIG. 6.

Shown in FIG. 6 is a front view of the optically transparent substrate 152, as first illustrated in FIG. 3. The second surface 166 may contain diffraction gratings 180, to transform optical signals passing through the transparent substrate 152, as also shown in FIG. 4. The gratings 180 may comprise a plurality of loci 184 of optical elements that form small grooves or etchings in the substrate 152. The loci 184 may be etchings arranged in straight lines 182 as shown in FIG. 7 or as concentric circles 184. The diffraction gratings 180 may be fabricated by a conventional laser ablation technique. Other fabrication techniques include, but are not limited to, mechanical scribing, chemical etching, and plasma etching. Fabrication details of the gratings 180 will not be described in detail, as they will be apparent to one skilled in the field of optics. The details of the loci 184 will be described in further detail below.

Figure 8:
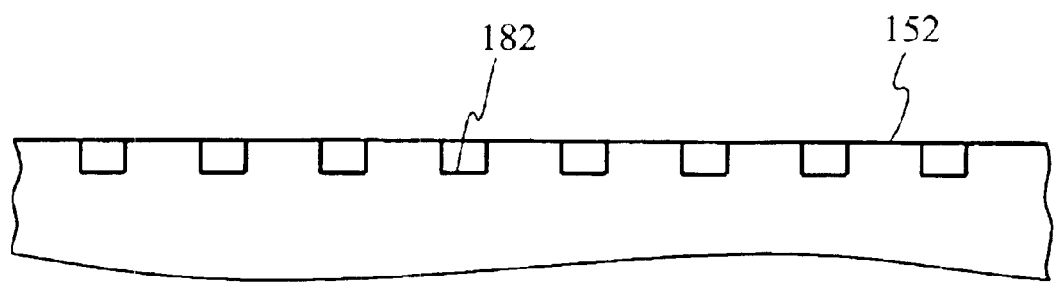
FIG. 8 is a cut-away side view of the substrate in FIG. 7.

The dimensions and shapes of the gratings 180 are not limited to any specific values, but a preferred structure is shown in FIGS. 7 and 8. The grooves may be formed on the surface of the substrate 152 and may be a few microns thick, but not through the entire substrate. The width, length, and separation of each groove may also be a few microns. The elements (i.e., squares) 196 shown in FIG. 7 represent portions of the substrate 152 removed by the laser ablation process.

Shown in FIG. 8 is a greatly enlarged section view of a locus 184 of grooves 182 formed to a circle. In a preferred embodiment of the invention, a plurality of conventional loci 184 of grooves, as described above, are disposed on the second surface 166 of substrate 152, such that the transmission axis of each optical port 176 passes through the respective loci 184 of grooves. Although the figures are shown with diffraction gratings 180 on the second surface 166, the gratings 180 could instead be disposed on the first surface 164 of the substrate 152 with the transmission axis of each port passing through the respective loci 184 of grooves. Additionally, gratings 180 could be disposed on both surfaces of the substrate 164, 166 in order to further promote optical attenuation, spatial field homogenizing or wavefront modification.

Figure 9:
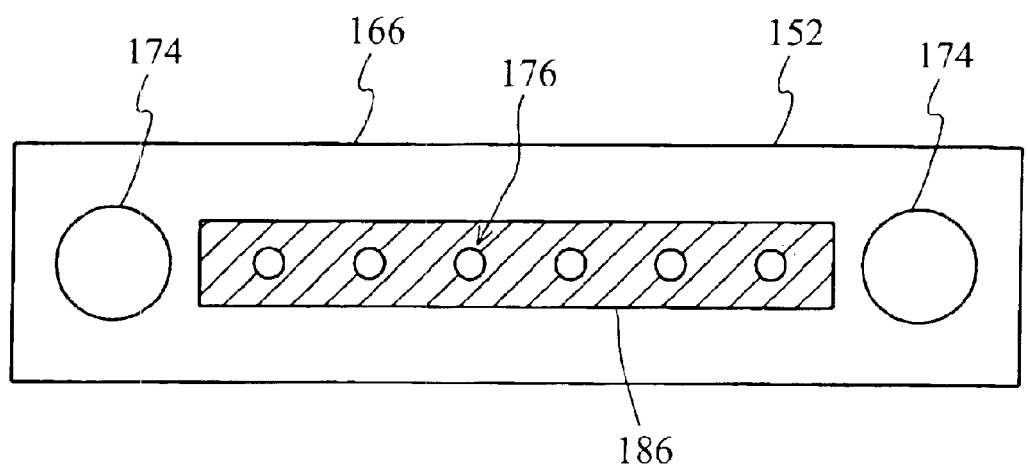
FIG. 9 is an alternate embodiment of the substrate of FIG. 3.

In an alternate embodiment of the present invention shown in FIG. 9, one larger locus 186 of grooves could be used for all ports 176 rather than one grating 180 for each optical port 176. In this embodiment, the larger locus 186 of grooves could be disposed on the substrate 152 such that the optical signal from each optical port 176 substantially passes through the larger locus 186 of gratings. The larger locus 186 could be disposed on either the first or second surface of the substrate 164, 166, or on both surfaces.

In a preferred embodiment of the present invention, the theoretical center of each locus 184 can be rough aligned to the center of each optical port 176 (i.e., aligned with a 50–100 micron tolerance). The symmetry about the theoretical center of a broad area locus 184 of grooves 184 allows for a lower placement tolerance. The need for precision alignment of the loci 184 of grooves to the optical ports 176 (i.e., precise alignment meaning a few microns, or sub-micron accuracy) can be reduced by making the surface area of the loci 184 larger than the optical ports 176. As a result, the loci of grooves 184 may be disposed on the substrate 152 with rough alignment, thus increasing manufacturing efficiency and output yield.

As the use of diffraction gratings 180 for appropriately guiding and diffracting light is widely understood, the working details of the diffraction gratings will not be discussed in detail.

As with FIG. 6, light could be traveling into or out of the page. Light striking diffraction gratings 180 could be diffracted or reflected. Reflected light coupled back into the optical ports 176 could reduce the performance of the optical array 144, further increasing optical noise. Anti-reflection coatings could be applied to the first or second surfaces 164 and 166 of the substrate to reduce reflections and maintain optical signal integrity. Yet, light reflected from the surfaces 164 and 166 will be diffracted when passing through the gratings 180, reducing the amount of light coupled back into the optical device, further promoting signal integrity.

The diffraction gratings 180 can then act as both a spatial field homogenizer and attenuator, changing beam uniformity and lowering optical power levels to ideal conditions for optical communications. The gratings 180 can expand the beam profile minimizing alignment tolerances between the fibers and optical device. Using the diffraction grating 180 as a beam attenuator can reduce the amount of light entering the fiber, further promoting eye-safety. In addition, less light transmitted down the optical fiber may not saturate photonic components receiving the optical signal.

The number of transverse and longitudinal modes emitted from a laser varies and is dependent on the physical structure, operating parameters and service time of the laser. Communications systems built with multimode optical fiber are susceptible to modal noise. This noise is dependent on many laser and fiber factors. Laser factors include but are not exclusive to the coherence length of the laser and the energy distribution emitted from the laser. Fiber factors include position of the laser with respect to the fiber, length of the fiber, structural variation of the fiber and fiber movement to name a few. These factors have process, operation, thermal and time variant factors that alter how laser energy is coupled into and will propagate through the fiber. Light striking diffraction gratings 180 reduces these effects and induces a uniform filling of the fiber reducing modal noise and increase the distance of a multimode communication link.

A specific embodiment of a method and apparatus for transmitting an optical communications signal has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

Numbering List
Method to Diffract and Attenuate an Optical Signal

| | |
|---|---|
| 10 | |
| 11 | |
| 12 | TO can |
| 13 | |
| 14 | optical device |
| 15 | |
| 16 | wire bonds |
| 17 | |
| 18 | spacer |
| 19 | |
| 20 | header |
| 21 | |
| 22 | can |
| 23 | |
| 24 | lense |
| 25 | |
| 26 | normal transmission axis |
| 27 | |
| 28 | |
| 29 | |
| 30 | Converter Assembly (angle polished ends) |
| 31 | |
| 32 | 1st substrate (bottom) |
| 33 | |
| 34 | electrooptical converter |
| 35 | |
| 36 | alignment substrate |
| 37 | |
| 38 | optical fiber |
| 39 | |
| 40 | angle polished end |
| 41 | |
| 42 | wire bond |
| 140 | optical converter assembly |
| 141 | |
| 142 | PCB |
| 143 | |
| 144 | optical array/devices |
| 145 | |
| 146 | transmission paths |
| 147 | |
| 148 | guide pins |
| 149 | |
| 150 | guide pin holder |
| 151 | |
| 152 | glass substrate |
| 153 | |
| 154 | MT ferrule/waveguide |
| 155 | |
| 156 | apertures in the ferrule |
| 157 | |
| 158 | ribbon fiber |
| 159 | |
| 160 | 1st surface of the waveguide |
| 161 | |
| 162 | opically transparent underfill |
| 163 | |
| 164 | 1st surface of the substrate |
| 165 | |
| 166 | 2nd surface of the substrate |
| 167 | |
| 168 | 90 degree bend |
| 169 | |
| 170 | |
| 171 | |
| 172 | conductive pads |

-continued

Numbering List
Method to Diffract and Attenuate an Optical Signal

| | |
|---|---|
| 173 | |
| 174 | alignment apertures in the substrate |
| 175 | |
| 176 | optical ports |
| 177 | |
| 178 | |
| 179 | |
| 180 | diffraction gratings as a whole |
| 181 | |
| 182 | individual grooves |
| 183 | |
| 184 | locus of grooves |
| 185 | |
| 186 | larger diffraction grating |
| 187 | |
| 188 | boring fixture |
| 189 | |
| 190 | recognition module |
| 191 | |
| 192 | laser 1 |
| 193 | |
| 194 | laser 2 |
| 195 | |
| 196 | squares |
| 197 | |
| 198 | |
| 199 | |
| 200 | |

What is claimed is:

1. A method of transmitting an optical communications signal, such method comprising the steps of:
    disposing a plurality of optical gratings on a first side of an optically transparent substrate;
    attaching an optical array having a plurality of optical ports of photo-transmitters or photo-receivers or a combination of photo-transmitters and photo-receivers to a second side the optically transparent substrate, so that the optically transparent substrate mechanically supports the optical array and so that an axis of transmission of the optical array passes directly through the substrate; and
    transmitting a plurality of optical communication signals of the optical array substantially through the plurality of optical gratings in the substrate, where each optical communication signal of the plurality of optical communication signals is transmitted between a respective port of the plurality of optical ports and a respective optical fiber of a plurality of optical fibers within an optical connector disposed on the first side of the optically transparent substrate through a respective grating of the plurality of gratings.

2. The method of transmitting an optical communications signal as in claim 1 further comprising defining the plurality of optical gratings in the substrate as mechanical etchings.

3. The method of transmitting an optical communications signal as in claim 1 further comprising defining the plurality of optical gratings as a plurality of laser etchings in the substrate.

4. The method of transmitting an optical communications signal as in claim 3 further comprising providing at least one locus of laser etchings disposed in the substrate for the plurality of optical ports.

5. The method of transmitting an optical communications signal as in claim 4 further comprising interposing an optically transparent underfill between the substrate and adjacent optical array, such that the plurality of transmission paths of the plurality of optical ports of the optical array pass directly through the optically transparent underfill.

6. The method of transmitting an optical communications signal as in claim 5 further comprising receiving the plurality of optical signals transmitted through the underfill, substrate and laser etchings into a respective plurality of optical fibers.

7. The method of transmitting an optical communications signal as in claim 6 further comprising coupling the plurality of optical signals through the underfill, substrate and gratings between the optical array and an optical connector.

8. The method of transmitting an optical communications signal as in claim 7 further comprising diffracting the plurality of optical signals of the plurality of optical ports of the optical array when the plurality of optical signals pass through the plurality of laser etchings.

9. An apparatus for transmitting optical communications signals, such apparatus comprising:

an optically transparent substrate;

an optical array, having a plurality of optical ports of photo-transmitters or photo-receivers or a combination of photo-transmitters and photo-receivers, attached to a first side of the optically transparent substrate, so that the optically transparent substrate mechanically supports the optical array and so that a plurality of transmission paths of the optical array pass directly through the substrate;

a plurality of optical gratings disposed on a second side of the substrate, such that the transmission paths of communication signals of the optical array pass substantially through the plurality of optical gratings; and an optical connector with a plurality of optical fibers disposed on the second side of the optically transparent substrate, where each optical communication signal is transmitted between a respective port of the plurality of optical ports and a respective optical fiber of the plurality of optical fibers through a respective grating of the plurality of gratings.

10. The apparatus for transmitting an optical communications signal as in claim 9 wherein the plurality of optical gratings disposed in the substrate further comprise a plurality of mechanical etchings in the substrate.

11. The apparatus for transmitting an optical communications signal as in claim 9 wherein the plurality of optical gratings disposed in the substrate further comprise a plurality of laser etchings in the substrate.

12. The apparatus for transmitting an optical communications signal as in claim 11 further comprising at least one locus of laser etchings disposed in the substrate for the plurality of optical ports.

13. The apparatus for transmitting an optical communications signal as in claim 12 further comprising an optically transparent underfill interposed between the substrate and optical array, such that the plurality of transmission paths of the plurality of optical ports of the optical array pass directly through the optically transparent underfill.

14. The apparatus for transmitting an optical communications signal as in claim 13 further comprising a means for receiving the plurality of optical signals transmitted through the underfill, substrate and optical gratings, from the plurality of optical ports of the optical array.

* * * * *